United States Patent [19]

Barre

[11] Patent Number: 5,122,689
[45] Date of Patent: Jun. 16, 1992

[54] CMOS TO ECL/CML LEVEL CONVERTER

[75] Inventor: Claude Barre, Munich, Fed. Rep. of Germany

[73] Assignee: Siemens Aktiengesellschaft, Munich, Fed. Rep. of Germany

[21] Appl. No.: 577,472

[22] Filed: Sep. 4, 1990

[30] Foreign Application Priority Data

Sep. 4, 1989 [DE] Fed. Rep. of Germany ....... 3929351

[51] Int. Cl.⁵ .................................. H03K 19/0175
[52] U.S. Cl. .................................. 307/475; 307/455; 307/443
[58] Field of Search ................... 307/475, 455, 443

[56] References Cited

U.S. PATENT DOCUMENTS

| 4,517,476 | 5/1985 | Barre | 307/455 |
| 4,615,951 | 2/1987 | Uragami | 307/455 |
| 4,849,660 | 7/1989 | Hayashi et al. | 307/475 |
| 4,977,338 | 12/1990 | Miyaoka et al. | 307/475 |

FOREIGN PATENT DOCUMENTS

| 0326996 | 8/1989 | European Pat. Off. | |
| 2443219 | 9/1976 | Fed. Rep. of Germany | |
| 1284114 | 11/1981 | Japan | |
| 60-141019 | 7/1985 | Japan | |
| 242419 | 10/1987 | Japan | 307/455 |

OTHER PUBLICATIONS

Integrated Electronics: Analog and Digital Circuits and Systems; (Millman et al) 1972; pp. 336-338.

Primary Examiner—David Hudspeth
Assistant Examiner—Andrew Sanders
Attorney, Agent, or Firm—Laurence A. Greenberg; Herbert L. Lerner

[57] ABSTRACT

A signal level converter for converting digital input signal levels to CML or ECL output signal levels upon an input signal level rise greater than an output signal level rise, includes a load resistor having first and second terminals. A current path is disposed between the first terminal of the load resistor and a first supply voltage potential. The second terminal of the load resistor is connected to a second supply voltage potential for CML or ECL output signal levels to form a digital H level. The first terminal of the load resistor forms a converter output for CML output signal levels and/or a bipolar transistor is connected as an emitter follower having a base electrode connected to the first terminal of the load resistor and an emitter electrode forming a converter output for ECL output signal levels. A current source field transistor is connected in the current path and forms a constant current source. A switching element is connected in the current path and includes at least one control field effect transistor having a gate electrode forming a converter input.

10 Claims, 2 Drawing Sheets

CMOS TO ECL/CML LEVEL CONVERTER

The invention relates to a signal level converter for converting digital input signal levels to CML or ECL output signal levels, upon an input signal level rise larger than an output signal level rise.

Such signal level converters are CMOS CML/ECL converters, for example, which identify the binary value represented by a CMOS input signal level in accordance with CMOS specifications and generate a corresponding output signal level provided by CML or ECL specifications for representing such a binary value. Signal level converters also invert the identified binary value and thus perform a logical converter function in addition to the level conversion.

As compared with the signals levels of CMOS logic elements, in which the voltage values for the digital L and H levels are equivalent to the value of the supply voltage potentials, the digital H level in current mode logic (CML) is at the more-positive value of the two supply voltage potentials, and the digital L level is more negative by only about 0.5 V. In the case of emitter coupled logic (ECL), the digital H level is approximately 0.9 V more negative, and the digital L level is approximately 1.7 V more negative, than the more-positive value of the two supply voltage potentials.

Assuming a supply voltage potential difference of approximately 5 V, a CMOS CML/ECL converter must accordingly convert a signal level rise of 5 V to a signal level rise of 0.5 V for CML or 0.8 V for ECL, while taking any signal-to-noise ratios into account.

A known CMOS CML/ECL converter includes a source-connected field effect transistor, having a source electrode connected to the more negative of the two supply voltage potentials and a drain electrode connected through a load resistor to the more positive of the two supply voltage potentials. A diode which is polarized in the flux direction is connected parallel to the load resistor.

With the diode, the signal level rise at the load resistor and thus at the converter output can be limited to a value predetermined by the flux voltage of the diode, although for silicon diodes that value is approximately 0.8 V.

However, the precise value of the flux voltage of such a diode, which can be used to limit the voltage value for the digital L level at the converter output, depends on the various conditions in the process of manufacturing the diode. The value of the flux voltage of a diode is also known to be temperature dependent.

For these reasons, the desired specifications in making a known CMOS CML/ECL converter are only approximately attainable. Moreover, the operating temperature range of an integrated circuit provided with the known CMOS CML/ECL converter is limited by the temperature sensitivity of the signal level converter.

It is accordingly an object of the invention to provide an integrated signal level converter for converting digital input signal levels to CML or ECL signal levels, upon an input signal level rise greater than the output signal level rise, which overcomes the hereinafore-mentioned disadvantages of the heretofore-known devices of this general type, and in which the output signal level rise at the converter output can be defined precisely, regardless of manufacturing tolerances or temperature and supply voltage fluctuations.

With the foregoing and other objects in view there is provided, in accordance with the invention, a signal level converter for converting digital input signal levels to CML or ECL output signal levels upon an input signal level rise greater than an output signal level rise, comprising a load resistor having first and second terminals, a current path disposed between the first terminal of the load resistor and a first supply voltage potential, the second terminal of the load resistor being connected to a second supply voltage potential for CML or ECL output signal levels to form a digital H level, the first terminal of the load resistor forming a converter output for CML output signal levels and/or a bipolar transistor connected as an emitter follower has a base electrode connected to the first terminal of the load resistor and an emitter electrode forming a converter output for ECL output signal levels, a current source field effect transistor being connected in the current path and forming a constant current source, and a switching element being connected in the current path and including at least one control field effect transistor having a gate electrode forming a converter input.

In the signal level converter constructed according to the invention, the signal level rise at the converter output is set solely by the current from a constant current source. The essential advantage of this feature is that a constant current source can easily be monitored by a reference voltage, which in turn may be formed by a reference voltage generator that is provided with circuitry provisions for compensating for process variations and temperature fluctuations.

However, a reference voltage generator of this type is not the subject of the present invention.

Another advantage of the signal level converter constructed according to the invention is that due to the strict separation of the switching function and level setting by a switch element or constant current source, it is possible to attain a steeper signal level converter transfer characteristic at the switching point, which is thus more advantageous.

In accordance with another feature of the invention, the current source field effect transistor and the control field effect transistor have drain-to-source paths being interconnected in a series circuit, and the current source field effect transistor has a gate electrode being acted upon by a reference voltage for setting a constant current value.

In accordance with a further feature of the invention, the switching element is connected between the load resistor and the constant current source for attaining rapid switching performance.

In accordance with an added feature of the invention, the current source field effect transistor has a source electrode not connected to, or in other words connected remote or facing away from, the switching element for attaining an exact voltage value for a digital L level at the converter output.

In accordance with an additional feature of the invention, the control field effect transistor is an n-MOS field effect transistor being dimensioned for permitting the signal level converter to be used as a TTL CML/ECL signal converter.

In accordance with yet another feature of the invention, the switch element has a plurality of control field effect transistors with drain-to-source paths being connected serially and/or parallel to one another and gate electrodes forming logically linkable converter inputs for forming logical links.

In accordance with yet a further feature of the invention, there is provided a further load resistor, and a current mirror circuit having an input current branch through which the current path is connected to the first supply voltage potential and at least one output current branch forming a further current path from the first supply voltage potential through the further load resistor to the second supply voltage potential, the further load resistor having a terminal connected to the second supply voltage potential and another terminal remote or facing from the second supply voltage potential forming a further converter output.

In accordance with yet an added feature of the invention, the current mirror circuit is formed of n-MOS field effect transistors.

In accordance with yet an additional feature of the invention, there are provided CML/ECL switching stages to which the signal level converter is connected as a disconnectable constant current source.

In accordance with a concomitant feature of the invention, there is provided a differential amplifier constructed as a current switch and having two bipolar transistors with coupled emitter electrodes, the current source field effect transistor being an n-MOS field effect transistor with a drain-to-source path and the control field effect transistor having a drain-to-source path connected to the drain-to-source path of the current source field effect transistor in a series circuit, the series circuit being connected between the first supply voltage potential and the emitter electrodes of the bipolar transistors.

Other features which are considered as characteristic for the invention are set forth in the appended claims.

Although the invention is illustrated and described herein as embodied in a signal level converter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 5:
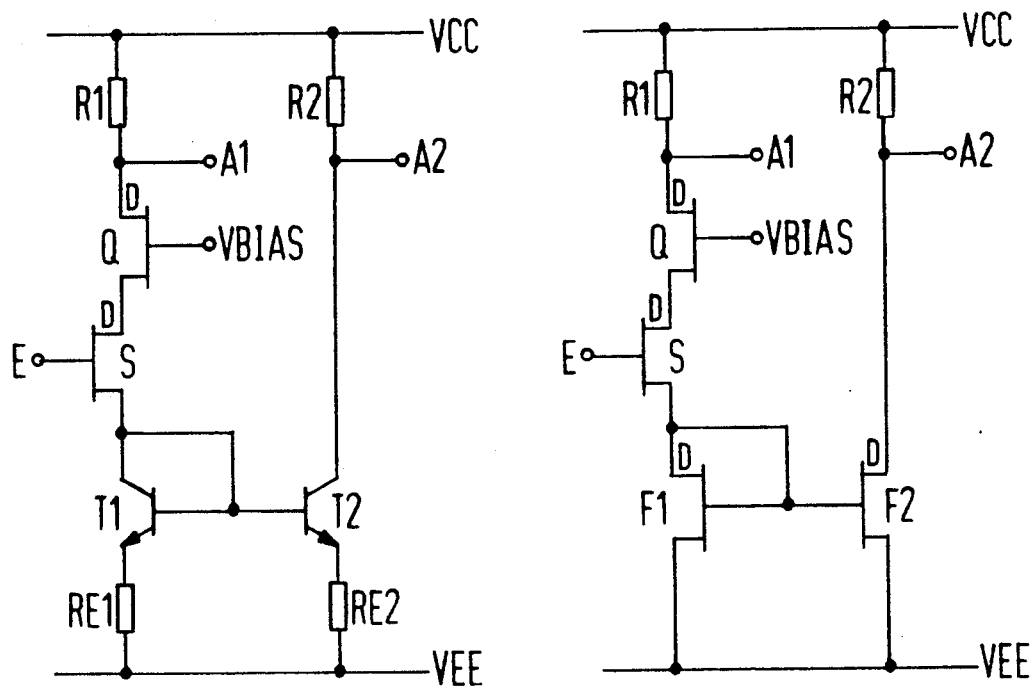
Figure 6:
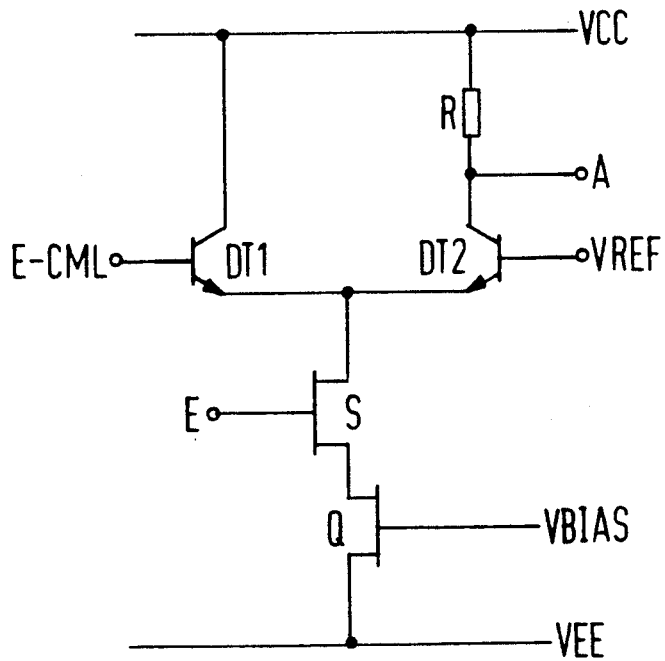

FIG. 5 includes two circuit diagrams of a signal level converter constructed in accordance with the invention, having a current mirror circuit for attaining a further converter output; and FIG. 6 is a circuit diagram of a CML/ECL switching stage, in which the signal level converter constructed in accordance with the invention serves as a disconnectable constant current source.

Figure 1:
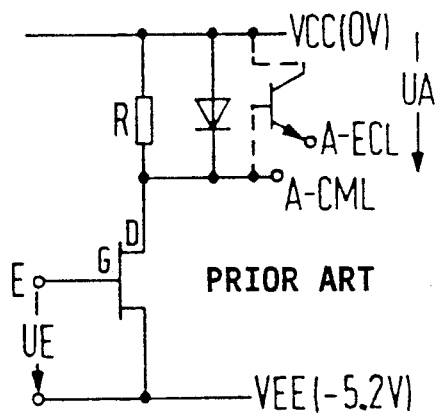
FIG. 1 is a schematic a circuit diagram of a known signal level converter.

Referring now to the figures of the drawing in detail and first, particularly, to FIG. 1 thereof, there is seen a circuit diagram of a known CMOS CML/ECL converter, which includes a single source-connected field effect transistor, with a diode connected in parallel in the conducting direction with its load resistor.

The field effect transistor, which is constructed as an n-MOSFET, has a source electrode S connected to a first supply voltage potential VEE and a drain electrode D connected through a load resistor R to a further or second supply voltage potential VCC that is more positive than the supply voltage potential VEE. The voltage difference between the two supply voltage potentials VEE, VCC is approximately 5.2 V and can thus be used for both CMOS circuits and CML and ECL circuits. In any case, the more-negative supply voltage potential VEE is provided as the 0 V or ground potential in CMOS logic, while in CML or ECL logic, the more-positive further voltage supply potential VCC is provided as the ground potential.

The field effect transistor has a gate electrode G which serves as a converter input E for CMOS signal levels, and the drain electrode D of the field effect transistor serves as a converter output A-CML for CML signal levels. In order to form a converter output A-ECL for ECL signal levels, an n-p-n transistor has a base-to-collector path connected in parallel with the load resistor R and an emitter electrode serving as the converter output A-ECL.

A diode which is polarized in the conducting direction permits a maximum voltage drop at the load resistor at the level of its flux voltage. As a result, a signal rise of only approximately 0.8 V can occur at the converter output A-CML.

Figure 2:
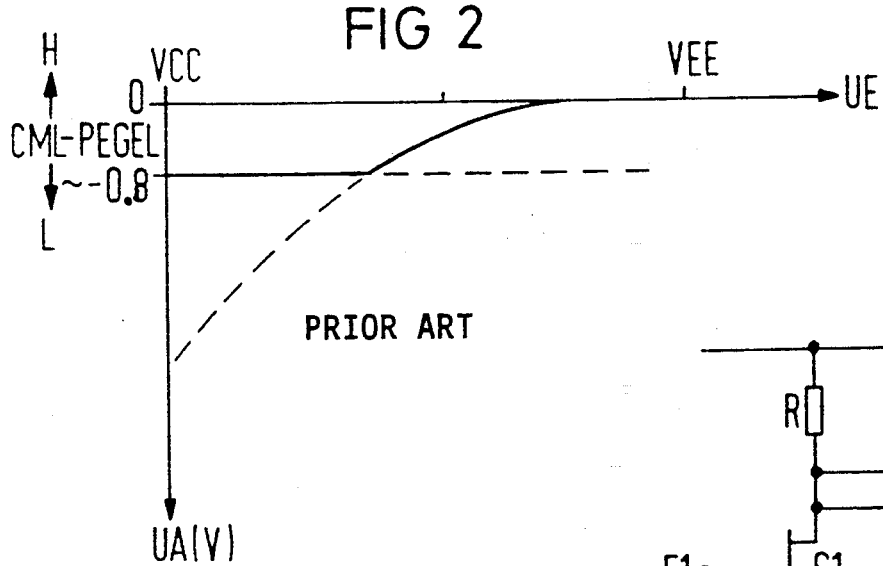
FIG. 2 is a graph of a transfer characteristic of the known signal level converter.

FIG. 2 shows a transfer characteristic for the known signal level converter of FIG. 1, from which the limitation in signal level voltage at the converter output A due to the flux voltage of the diode is clearly apparent.

Figure 3:
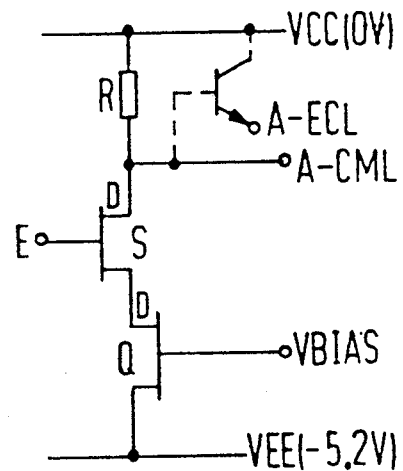
FIG. 3 is a circuit diagram of a signal level converter constructed in accordance with the invention.

FIG. 3 is a circuit diagram of a signal level converter constructed in accordance with the invention and serving as a CMOS CML/ECL converter, having a current source field effect transistor Q, which will be referred to below as the current source FET Q for short, and a series-connected control field effects transistor S, which will be referred to below as the control FET S for short. The drain-to-source paths of the current source FET Q and the control FET S as well as a load resistor R form a series circuit. In the exemplary embodiment shown, the drain-to-source path of the current source FET Q is connected to the supply voltage potential VEE (of −5.2 V, for instance), and the drain-to-source path of the control FET S is connected through the load resistor R to the further supply voltage potential VCC (0 V), which is more positive than the supply voltage potential VEE.

For some applications it would also be conceivable for the two field effect transistors to be in reverse order in the series connection, and for the current source FET Q to be connected with its drain-to-source path between the load resistor R and the control FET S. However, the switching speed of the signal level converter is higher if the control FET S is connected to the load resistor R. The voltage value for the digital L level is kept more constant if the source electrode of the current source FET Q is remote from the control FET S.

In the present exemplary embodiment, both the current source FET Q and the control FET S are constructed as symmetrical n-MOS field effect transistors, although naturally there would be no reason not to construct one or both of them as p-MOS field effect transistors instead.

However, if the control FET S is constructed as an n-MOS field effect transistor, then the threshold point of the signal level converter constructed in accordance with the invention can be shifted by the dimensioning of the control FET S, in such a way that it can be used as a TTL CML/ECL signal level converter. However, the ensuing discussion will continue to be based on a CMOS CML/ECL converter.

The gate electrode of the current source FET Q is acted upon by a reference voltage VBIAS and as a result forms a constant current source. The gate electrode of the control FET S serves as a converter input E for CMOS signal levels.

A pickup that forms a converter output A-CML for CML signal levels is provided at the first terminal of the load resistor R that is remote or facing away from the second terminal thereof which is connected to the second or further supply voltage potential VCC. In order to form ECL signal levels, the collector-to-base path of an n-p-n transistor may be connected parallel to the load resistor R, as in known signal level converters. The emitter electrode of the n-p-n transistor then serves as the converter output A-ECL for ECL signal levels.

This kind of conversion of CML signal levels to ECL signal levels with the aid of a bipolar transistor is always possible, and as a result, for the sake of simplicity, reference will only be made below to the converter output A-CML (which will simply be referred to below as the converter output A).

With a digital CMOS H level at the converter input E having a voltage value which is approximately equivalent to the value of the further supply voltage potential VCC (that is, 0 V), the control FET S and thus the current path are closed through the load resistor R. The current through the load resistor R and thus the voltage drop across the load resistor R, which generates an additional CML L level at the converter output A, is determined solely by the reference voltage VBIAS at the current source FET.

With a digital CMOS L level at the converter input E having a voltage value which is approximately equivalent to the value of the supply voltage potential VEE (that is, −5.2 V), the control FET S is open, in other words it has a very high resistance. No significant current flows through the load resistor R. The converter output A is therefore at the voltage value of the further supply voltage potential VCC (0 V), which corresponds to a digital CML H level.

Figure 4:
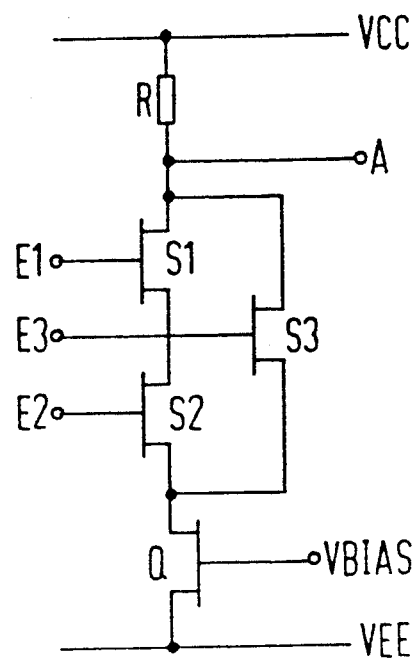
FIG. 4 is a circuit diagram of a signal level converter constructed in accordance with the invention with a logical linkage of a plurality of converter inputs.

FIG. 4 is a circuit diagram of a signal level converter which is constructed according to the invention and serves as a CMOS CML/ECL converter, having a circuit element formed of first, second and third control FETs S1, S2, S3. These signal level converters are only distinguished from the signal level converter of FIG. 3 in that the control FET S in FIG. 3 is replaced with three control FETs S1, S2, S3 to form a logic element.

The drain-to-source paths of the first and second control FETs S1 and S2 form a series circuit, and the drain-to-source path of the third control FET S3 is connected parallel to this series circuit. The current source FET Q and the load resistor R respectively connect this series circuit to the supply voltage potential VEE and to the further supply voltage potential VCC.

The gate electrodes of the three control FETs S1, S2, S3 each form one converter input E1, E2, E3. The series circuit of the first and second control FETs S1, S2 forms a logical AND link, because a current path through the first and second control FETs S1, S2 comes about only if the converter inputs E1 and E2 are acted upon by a digital CMOS H level (VCC). The series circuit including the first and second control FETs S1, S2 can be bridged through the third control FET S3, which is equivalent to a logical OR link. Accordingly, a digital CML L level should be expected at the converter output only when either the converter inputs E1 and E2, or the converter input E3, is at a digital CMOS H level.

FIG. 5 shows two circuit diagrams for a signal level converter constructed in accordance with the invention and serving as a CMOS CML/ECL converter, with each circuit diagram having a current mirror circuit to produce one further converter output.

The two circuit diagrams for signal level converters constructed according to the invention differ from one another only in that the current mirror circuit of the exemplary embodiment shown in the left diagram is constructed by two bipolar transistors with associated emitter resistors, while in the exemplary embodiment of the right diagram the current mirror circuit includes two n-MOS field effect transistors.

In the signal level converter constructed in accordance with the invention and shown in the left diagram, a series circuit of the drain-to-source paths of one current source FET Q and one control FET S is connected at one end (which is the drain electrode D of the current source FET Q constructed as a n-MOSFET in the left diagram) to the further supply voltage potential VCC through a load resistor R1, and the series circuit is connected at the opposite end through the collector-to-emitter path of a first n-p-n transistor T1 belonging to the current mirror circuit, and an emitter resistor RE1 of the transistor T1 to the supply voltage potential VEE. A second n-p-n transistor T2 belonging to the current mirror circuit is base-coupled to the first n-p-n transistor T1, its collector electrode is connected through a further load resistor R2 to the further supply voltage potential VCC and its emitter electrode is connected through an associated emitter resistor RE2 to the supply voltage potential VEE. The collector electrode and the base electrode of the first n-p-n transistor T1 are connected to one another. The first terminal of the load resistor R1 remote or facing away from the second terminal thereof which is connected to the second or further supply voltage potential VCC forms the converter output A1, and the first terminal of the further load resistor R2 remote or facing away from the second terminal thereof which is connected to the second or further supply voltage potential VCC forms a further converter output A2.

In the signal level converter according to the invention and shown in the right-hand circuit diagram of FIG. 5, the bipolar transistors (n-p-n transistors T1, T2) and their emitter resistors RE1, RE2 are replaced by two n-MOS field effect transistors F1, F2. Thus the end of the series circuit of the drain-to-source paths of the current source and control FETs Q, S which is remote or faces away from the load resistor R1, is connected through the drain-to-source path of a first field effect transistor F1 to the supply voltage potential VEE. The drain electrode D of a second field effect transistor F2, which is gate-coupled to the first field effect transistor F1, is connected through a further load resistor R2 to the further supply voltage potential VCC, and its source electrode is connected to the supply voltage potential VEE. The gate electrode of the first field effect transistor F1 is also connected to its drain electrode D. The converter output A1 and the further converter output A2 are provided by the respective first terminals of the load resistor R1 and the further load resistor R2 that are remote or facing away from the further supply voltage potential VCC.

The current mirror circuit, whether it is constructed with bipolar transistors or with field effect transistors, transfers the current flowing through the series circuit of the current source and control FETs Q, S, and thus the current flowing through the input current branch of the current mirror circuit, to its output current branch. The input current branch is provided by the first n-p-n transistor T1 and the first field effect transistor F1, and the output current branch is provided by the second n-p-n transistor T2 and the second field effect transistor F2. Thus the current flowing through the load resistor R1 has the same intensity as the current flowing through the further load resistor R2, and thus if the two load resistors R1, R2 have the same resistances, the voltage values of the two converters outputs A1, A2 are always the same.

The two converter outputs A1, A2 thus furnish output signal levels that are not dependent on one another in terms of load. Moreover, the two output signals at the converter outputs A1, A2 are not dependent on one another in terms of malfunction, so that subsequent circuit inputs cannot affect one another in the event of a malfunction.

If needed, a current mirror circuit may naturally be provided with a plurality of output current branches.

FIG. 6 is a circuit diagram for a CML or ECL switching stage, in which the constant current source, that is otherwise typically constructed with bipolar transistors, is replaced with a series circuit of a control FET S and a current source FET Q in accordance with the invention.

The CML or ECL switching stage substantially includes a differential amplifier, which is constructed as a current switch, with first and second emitter-coupled n-p-n transistors DT1, DT2. The base electrode of the first n-p-n transistor DT1 forms a switching stage input E-CML for CML signal levels. The collector electrode of the first n-p-n transistor DT1 is connected to the further supply voltage potential VCC. The collector electrode of the second n-p-n transistor DT2 is connected through a load resistor R to the further supply voltage potential VCC. The collector electrode of the second n-p-n transistor DT2 also serves as a converter output A for CML signal levels. The base electrode of the second n-p-n transistor DT2 is acted upon by a switching threshold reference voltage VREF, the value of which is located approximately in the middle between the voltage values for the digital L and H CML levels.

The two emitter electrodes of the two n-p-n transistors DT1, DT2 that are connected to one another, are connected to the supply voltage potential VEE through a series circuit of the drain-to-source paths of one control FET S and one current source FET Q. The gate electrode of the control FET S forms a converter input E for CMOS signal levels, and a reference voltage VBIAS for adjusting a constant current for the differential amplifier is present at the gate electrode of the current source FET Q, which is constructed as an n-MOS field effect transistor.

In both the exemplary embodiment of FIG. 6 and the exemplary embodiment of FIG. 5, the order of the current source FET Q and the control FET S can be reversed.

It would also be conceivable to replace the control FET with a plurality of serial or parallel control FETs to form a logic element. Aside from that, the signal level converter constructed in accordance with the invention and shown in FIG. 6 already includes a a logical link. Thus a digital CML L level can be established at the converter output A only whenever the converter input E of the control FET S has a digital CML H level, and the CML converter input E-CML has a digital CML L level, or in other words approximately −0.5 V.

On the other hand, by using a signal level converter constructed in accordance with the invention in a CML-ECL switching stage, this stage can be switched off if it is not needed, thereby economizing on power.

I claim:

1. Signal level converter, comprising a resistor having first and second terminals, said first terminal being connected to a first supply voltage potential, first and second MOS transistors each having a gate electrode and a drain-to-source path, said drain-to-source paths of said MOS transistors being interconnected in a series circuit disposed between said second terminal of said resistor and a second supply voltage potential, an output signal terminal connected to said second terminal of said resistor, said gate electrode of said first MOS transistor forming an input signal terminal, said gate electrode of said second MOS transistor being connected to a reference potential, and including further MOS transistors having gate electrodes and drain-to-source paths being connected in series with said drain-to-source path of said first MOS-transistor, said gate electrodes of said further MOS transistors forming further input signal terminals.

2. Signal level converter, comprising a resistor having first and second terminals, said first terminal being connected to a first supply voltage potential, first and second MOS transistors each having a gate electrode and a drain-to-source path, said drain-to-source paths of said MOS transistors being interconnected in a series circuit disposed between said second terminal of said resistor and a second supply voltage potential, an output signal terminal connected to said second terminal of said resistor, said gate electrode of said first MOS transistor forming an input signal terminal, said gate electrode of said second MOS transistor being connected to a reference potential, and including further MOS transistors having gate electrodes and drain-to-source paths connected in parallel to said drain-to-source path of said first MOS transistor, said gate electrodes of said further MOS transistors forming further input signal terminals.

3. Signal level converter, comprising a resistor having first and second terminals, said first terminal being connected to a first supply voltage potential, first and second MOS transistors each having a gate electrode and a drain-to-source path, said drain-to-source paths of said MOS transistors being interconnected in a series circuit disposed between said second terminal of said resistor and a second supply voltage potential, an output signal terminal connected to said second terminal of said resistor, said gate electrode of said first MOS transistor forming an input signal terminal, said gate electrode of said second MOS transistor being connected to a reference potential, and including a third MOS transistor having a gate electrode and a drain-to-source path connected in series with said drain-to-source path of said first MOS transistor, and further MOS transistors having gate electrodes and drain-to-source paths connected in parallel to said drain-to-source path of said first and third MOS transistors, said gate electrodes of said third MOS transistor and said gate electrodes of said further MOS transistors forming further input signal terminals.

4. Signal level converter, comprising a resistor having first and second terminals, said first terminal being connected to a first supply voltage potential, first and second MOS transistors each having a gate electrode and a drain-to-source path, said drain-to-source paths of said MOS transistors being interconnected in a series circuit disposed between said second terminal of said resistor and a second supply voltage potential, an output signal terminal connected to said second terminal of said resistor, said gate electrode of said first MOS transistor forming an input signal terminal, said gate electrode of said second MOS transistor being connected to a reference potential, and including a load resistor, a further output signal terminal, and a current mirror circuit having an input current branch and an output current branch, said input current branch being disposed between the series circuit of said drain-to-source paths of said first and second MOS transistors, said output current branch being disposed between the first and second supply voltage potentials, said load resistor being disposed in said output current branch and being connected between the first supply voltage potential and said further output signal terminal.

5. Signal level converter, comprising a resistor having first and second terminals, said first terminal being connected to a first supply voltage potential, first and second MOS transistors each having a gate electrode and a drain-to-source path, said drain-to-source paths of said MOS transistors being interconnected in a series circuit disposed between said second terminal of said resistor and a second supply voltage potential, an output signal terminal connected to said second terminal of said resistor, said gate electrode of said first MOS transistor forming an input signal terminal, said gate electrode of said second MOS transistor being connected to a reference potential, and including first and second bipolar transistors each having a base, an emitter and an collector-to-emitter path, said collector-to-emitter path of said first bipolar transistor being disposed between said second terminal of said resistor and said series circuit of said drain-to-source paths of said first and second MOS transistors, said base being connected to a further reference potential, said collector-to-emitter path of said second bipolar transistor being disposed between the first supply voltage potential and said emitter of said first bipolar transistor, said base of said second bipolar transistor being a further input signal terminal.

6. Signal level converter according to claim 1, including a bipolar transistor having a base, a collector and an emitter, said collector being connected to the first supply voltage potential, said base being connected with said first output signal terminal, and said emitter being connected to a second output signal terminal.

7. Signal level converter according to claim 2, including a bipolar transistor having a base, a collector and an emitter, said collector being connected to the first supply voltage potential, said base being connected with said first output signal terminal, and said emitter being connected to a second output signal terminal.

8. Signal level converter according to claim 3, including a bipolar transistor having a base, a collector and an emitter, said collector being connected to the first supply voltage potential, said base being connected with said first output signal terminal, and said emitter being connected to a second output signal terminal.

9. Signal level converter according to claim 4, including a bipolar transistor having a base, a collector and an emitter, said collector being connected to the first supply voltage potential, said base being connected with said first output signal terminal, and said emitter being connected to a second output signal terminal.

10. Signal level converter according to claim 5, including a third bipolar transistor having a base, a collector and an emitter, said collector being connected to the first supply voltage potential, said base being connected with said first output signal terminal, and said emitter being connected to a second output signal terminal.

* * * * *